(12) United States Patent
Sengupta et al.

(10) Patent No.: US 6,191,359 B1
(45) Date of Patent: Feb. 20, 2001

(54) MASS REFLOWABLE WINDOWED PACKAGE

(75) Inventors: Kabul S. Sengupta, Tempe; Carl E. Sklenicka, Phoenix; Deborah L. Thompson, Tempe; Raul A. Arellano, Phoenix, all of AZ (US); Naoyuki Nagai, Kagoshima (JP); Nobuyuki Takehashi, Shinga (JP); Kouichiro Nomoto, Kagoshima (JP)

(73) Assignee: Intel Corporation, Santa Clara, CA (US)

( * ) Notice: Under 35 U.S.C. 154(b), the term of this patent shall be extended for 0 days.

(21) Appl. No.: 09/172,710

(22) Filed: Oct. 13, 1998

(51) Int. Cl.[7] ........................................... H01L 23/02
(52) U.S. Cl. ................ 174/52.3; 174/52.4; 257/680; 257/704; 357/72; 357/74; 250/239; 73/754; 73/756
(58) Field of Search ................. 174/52.3, 52.4; 250/208.1, 237, 239; 73/756, 754; 257/680, 704

(56) References Cited

U.S. PATENT DOCUMENTS

| | | | |
|---|---|---|---|
| 4,644,384 | * | 2/1987 | Charoensakvirochan et al. .... 357/74 |
| 4,697,203 | * | 9/1987 | Sakai et al. ............................. 357/72 |
| 5,691,480 | * | 11/1997 | Cook, Sr. et al. ....................... 73/756 |
| 5,821,532 | * | 10/1998 | Beaman et al. ....................... 250/239 |

OTHER PUBLICATIONS

Japanese abstract for 58–140155, Aug. 19, 1983, 2 pgs.
Japanese abstract for 5–90548, Apr. 9, 1993, 2 pgs.
Japanese abstract for 10–65132, Mar. 6, 1998, 2 pgs.

* cited by examiner

Primary Examiner—William A. Cuchlinski, Jr.
Assistant Examiner—Ronnie Mancho
(74) Attorney, Agent, or Firm—Blakely, Sokoloff, Taylor & Zafman LLP

(57) ABSTRACT

A windowed package is capable of withstanding a mass reflow process. During mass reflow, the entire package is subjected to the solder reflow temperature. In one embodiment, the lid comprises a ceramic frame and a glass window.

15 Claims, 4 Drawing Sheets

MASS REFLOWABLE WINDOWED PACKAGE

BACKGROUND OF THE INVENTION

1. Field of the Invention

The described invention relates to the field of integrated circuit packages. In particular, the invention relates to an integrated circuit package capable of being mounted to a circuit board via a mass reflow process.

2. Description of Related Art

A windowed integrated circuit package is used for various applications in which an integrated circuit is illuminated or irradiated by light or other radiation sources located outside the integrated circuit package. An image sensor is one use of a windowed integrated circuit package.

For example, a photodiode array may be placed within a windowed integrated circuit package. The photo-detector array provides an image data output based upon the light incident on the photo-detector array. The photo-detector array may be used for capturing images or for other image reproduction applications.

Integrated circuit (IC) packages are mounted on circuit boards by various techniques including mass reflow and manual and hot bar soldering of the package to the circuit board. Manual soldering and hot bar soldering, however, are relatively slow and expensive processes.

Mass reflow board mounting is a faster, automated process. Mass reflow refers to one of several different techniques that raise the temperature of the IC package to approximately 215 to 225 degrees C. At these elevated temperatures, solder residing on pads of the integrated circuit board melts and adheres to leads on the IC package. After the solder cools, the IC package remains firmly coupled to the solder pads. Mass reflow includes infrared, convection, and vapor phase techniques.

Non-ceramic packages such as windowed plastic packages are more desirable than ceramic packages because they are of lower cost than corresponding ceramic windowed packages. However, available windowed plastic packages do not meet the thermal requirements for mass reflow board mounting. These windowed plastic packages are mounted to circuit boards using techniques such as manual soldering that keep the package bulk from reaching the elevated temperatures of the mass reflow process.

Standard windowed plastic packages tested on the mass reflow process exhibit problems such as cracked lids, lid-sealant separation due to thermal expansion mismatch between the plastic and glass window, and delamination of the die from the die attach.

SUMMARY OF THE INVENTION

A windowed package is capable of withstanding a mass reflow process. During mass reflow, the entire package is subjected to the solder reflow temperature. In one embodiment, the lid comprises a ceramic frame and a glass window.

DETAILED DESCRIPTION

A windowed package capable of being mounted via a mass reflow process is disclosed. Applicants have found that modifying a windowed plastic QFP package available through Kyocera Corporation based in Kyoto, Japan allows the plastic package to withstand the mass reflow process without the lid separating from the mold package or the die delaminating from the mold package.

Windowed plastic packages may be used to house an image sensor. In one embodiment, an image sensor die has dimensions larger than 240 mils by 240 mils. A direct glass-to-plastic seal is not achieved for the package housing such a large die. Instead, a ceramic frame is employed to allow a ceramic-to-plastic coupling and a ceramic-to-glass coupling, as will be described.

Figure 1:
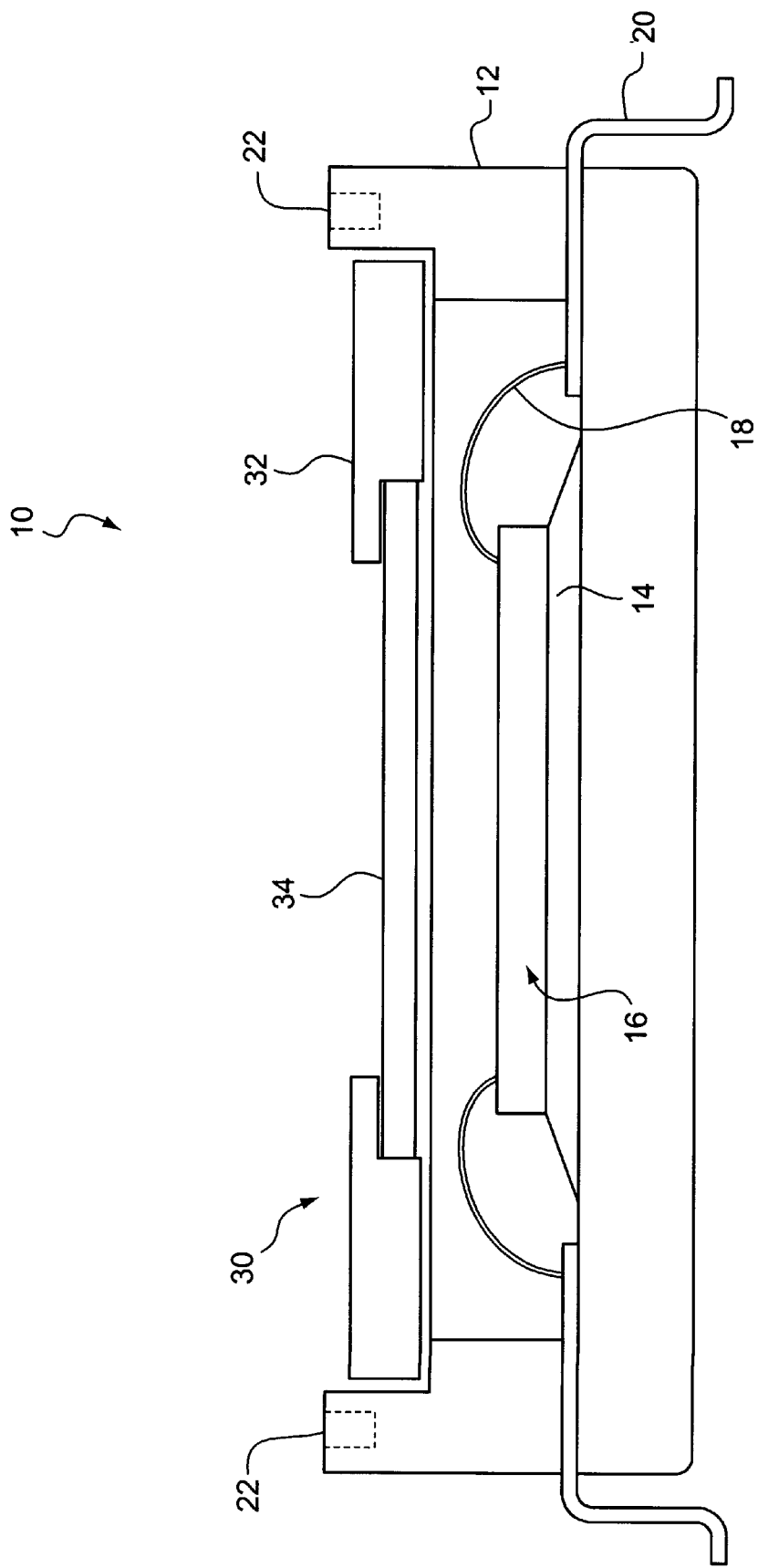
FIG. 1 shows a cross sectional block diagram of the windowed QFP package 10 as modified by the Applicants.

FIG. 1 shows a cross sectional block diagram of a windowed QFP package 10 that is mass reflowable. A non-ceramic mold body 12 makes up the package body. In one embodiment, the non-ceramic mold package is made with a low-moisture plastic, such as a low-moisture mold compound of ortho-cresol-novolac developed by Kyocera Corporation. In one embodiment, depressions 22 indicate where ejector pins were used to remove the mold package after being formed. Appendix 1 includes an example of the material characteristics of a low-moisture mold compound of Kyocera Corporation.

Die attach 14 is used to hold the die 16 in place. In one embodiment, the die attach 14 is a low rigidity epoxy such as a silver-filled epoxy manufactured by Ablestik Electronic Materials and Adhesives, based in Rancho Dominguez, California.

Wire bonds 18 attach the die 16 to a lead frame 20. The die attach 14 is selected to withstand the elevated temperatures of the mass reflow process. Delamination of the die 16 from the die attach 14 or mold package 12 may be a problem during mass reflow. Applicants have determined that a two step cure process for the die attach, as will be discussed with respect to FIG. 3, solves this problem.

A lid 30 seals the mold package. In one embodiment, the lid 30 comprises a ceramic frame 32 made of alumina. The ceramic frame 32 holds a transparent window. In one embodiment, the ceramic frame 32 includes a recessed ledge within which a glass window 34 resides. In one embodiment, the mold package 12 and the ceramic frame 32 are sealed using a bis-phenol A type epoxy. The epoxy seal may also be used to seal the ceramic frame 32 to the glass window 34. Appendix 2 summarizes the characteristics of a bis-phenol A-type sealant that is suitable for use with the present invention.

The modified windowed package is particularly suited for, but not limited to, Complementary Metal Oxide Semiconductor (CMOS) image sensors because their die size can exceed 240 mils by 240 mils. An embodiment of the package suitable for an image sensor includes a window having a slightly larger area than that of the light-sensitive portion of the die.

Figure 2:
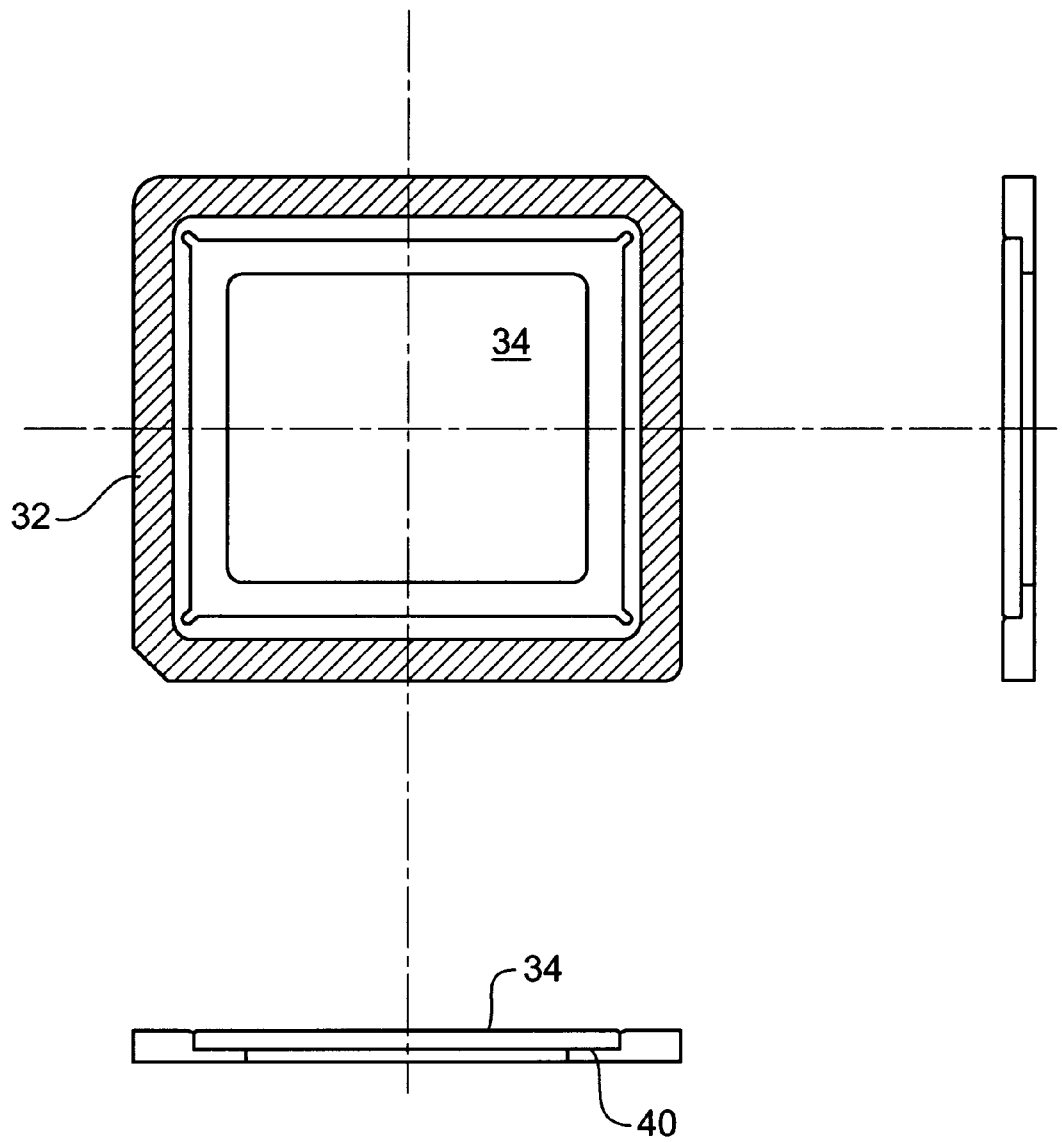
FIG. 2 shows a schematic of one embodiment of the package lid, including the ceramic frame and glass window.
Figure 3:
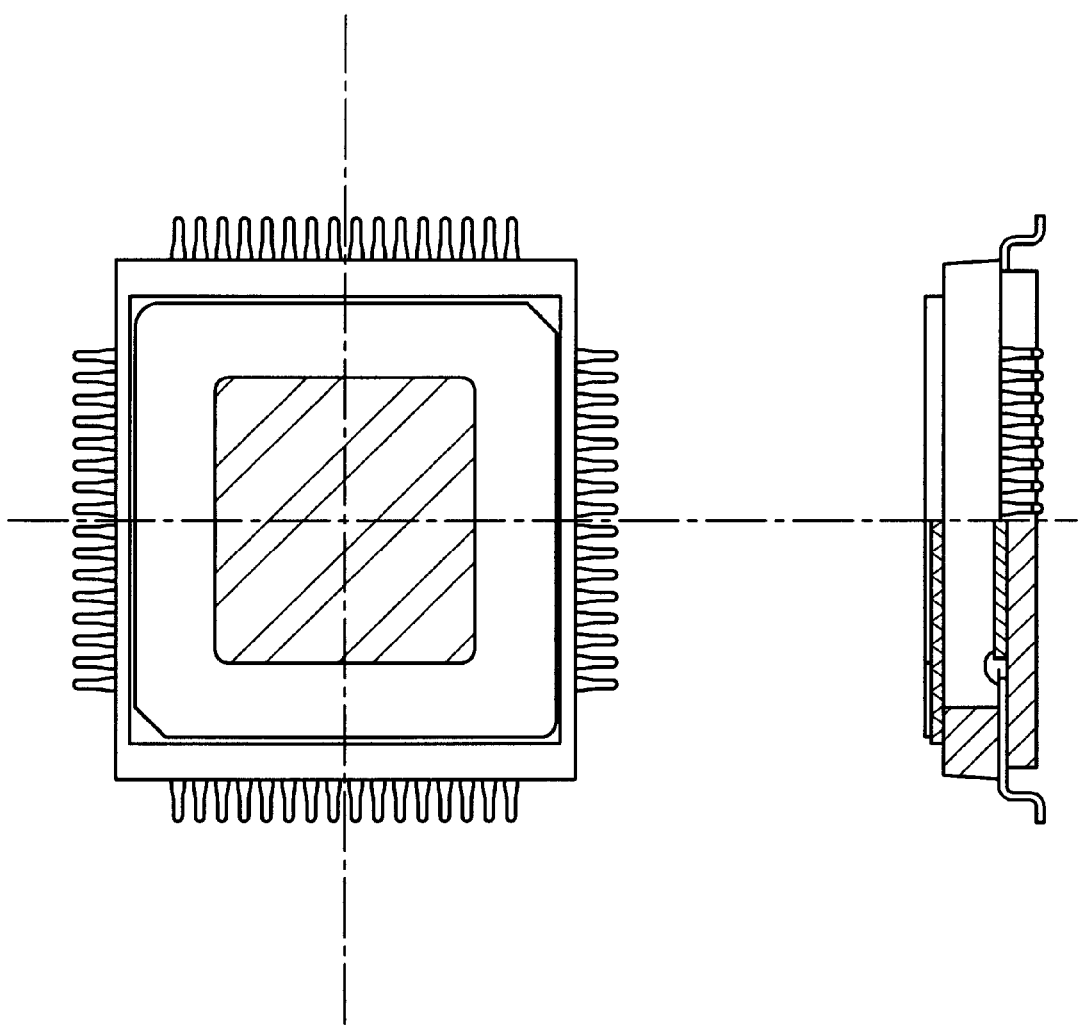
FIG. 3 shows a schematic of one embodiment of the entire IC package.

In one embodiment, the window is approximately 1.2 times the area of the light-sensitive portion of the die. The window size, however, varies depending on its distance away from the die. FIGS. 2 and 3 shows schematic diagrams of one embodiment of the lid and mold package.

FIG. 2 shows a schematic of one embodiment of the package lid 30, including the ceramic frame 32 and glass window 34. In one embodiment, a glass window 34 is seated into a recessed ledge 40 in the ceramic frame 32.

FIG. 3 shows a schematic of one embodiment of the entire IC package 50 in accordance with present invention. Although the embodiment shown includes a particular type of lead frame (quad flat pack -QFP), other types of lead frames may be employed. Moreover, other packages may be used, including leadless packages such as micro ball grid array (micro BGA), leadless chip carrier (LCC), dual in-line package (DIP), and so forth.

Figure 4:
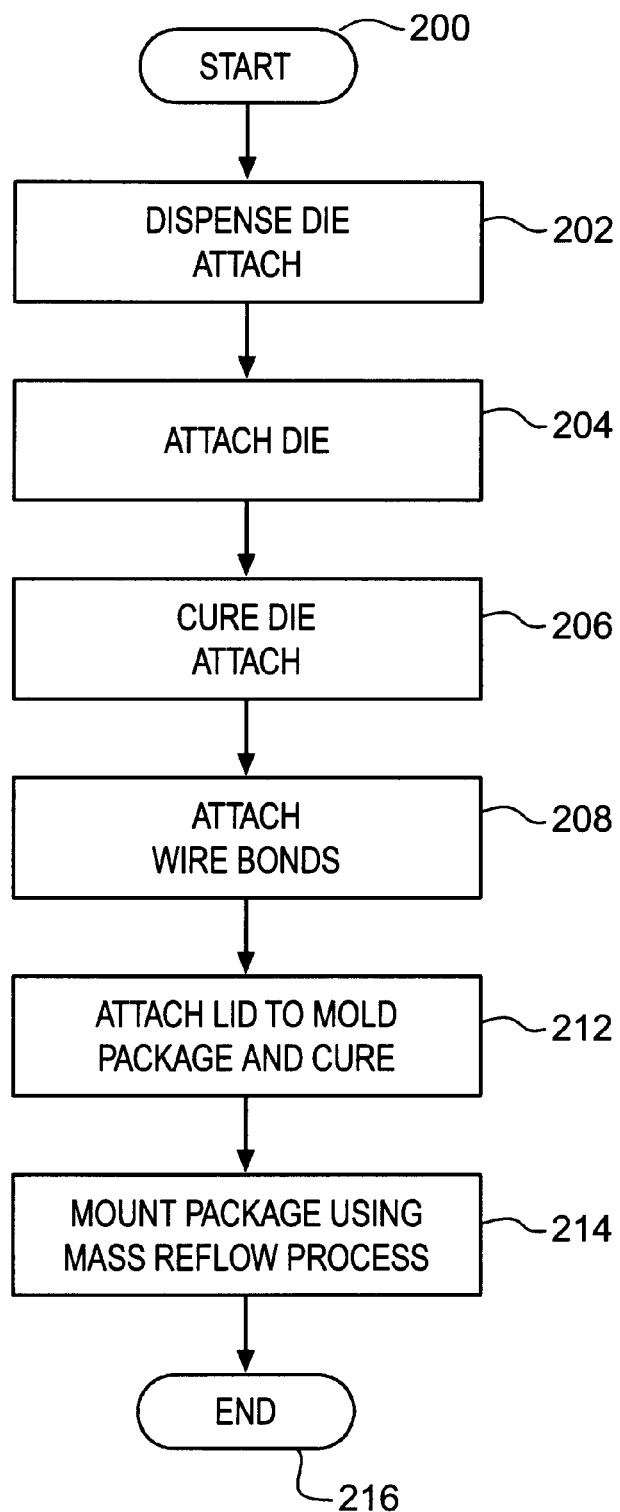
FIG. 4 shows one embodiment of the process taken in attaching a die into a windowed non-ceramic package.

FIG. 4 shows the process steps taken in one embodiment of a method for attaching a die into a windowed non-ceramic package. At step 202, die attach is dispensed on the mold package. In one embodiment, the die attach is comprised of a low rigidity epoxy such as a silver-filled epoxy, as previously stated.

The process continues at block 204, at which the die is scrubbed, or moved back and forth while pressure is applied to firmly attach the die to the die attach. Good adhesion of the die to a smooth surface of the mold package is achieved without plating the back-side of the die with gold.

The die attach is cured at block 206. It is important to eliminate voids in the die attach, which may cause delamination problems. It has been found that a two stage cure process works better than a one stage cure process for eliminating voids in the die attach. In one embodiment, the die attach is baked at approximately 100 degrees C. for approximately one hour, then the die attach is baked at approximately 150 degrees C. for approximately another hour.

At block 208, wire bonds are attached between the die and the lead frame of the mold package.

At block 212, the lid is attached to the mold package. In one embodiment, the lid comprises the glass window 34 attached to the ceramic frame 32 with a bisphenol A type epoxy. The epoxy is cured by baking. In one embodiment, the curing is performed by raising the temperature to approximately 150 degrees C. for approximately 70 minutes. In one embodiment, the lid is attached to the mold package using the same epoxy that was used to attach the glass window 34 to the ceramic frame 32, and the epoxy is cured by also raising the temperature to approximately 150 degrees C. for approximately 70 minutes.

In one embodiment, the above steps are performed using laminar flow hoods in a clean room that meets level class sub 100, in which there is less than 100 particles of contamination of one micron or less per cubit meter. This helps to prevent particle contamination of the die during assembly.

In one embodiment, the window has a scratch-dig specification of 20 microns. The scratch-dig specification denotes the largest allowable defect in the glass. A larger defect may interfere with the imaging performance of the image sensor.

In order to reduce moisture in the sealed package prior to performing the mass reflow process, an extended bake cycle is used just prior to bag. In one embodiment, the sealed package is baked at 125 degrees C. for 48 hours, then it is vacuum sealed in a moisture barrier bag for storage or shipment. This allows the sealed package to meet the Institute for Interconnecting and Packaging Electronic Circuits (IPC) level 4 surface mount requirements. (The IPC is a trade association representing over 2300 companies in the electronic interconnection industry worldwide.)

When the sealed package is ready to be mounted, it is removed from the bag and mounted to a circuit board using a mass reflow process, as shown at block 214. There are various types of mass reflow processes. In one embodiment, an IR/convection mass reflow process is employed that conforms to the following:

1) peak package body temperature of approximately 225 degrees C. for up to 90 seconds;
2) time above 215 degrees C. is approximately 30 seconds;
3) time above 183 degrees C. is approximately 140 seconds.

The windowed non-ceramic package is able to withstand the above mass reflow process without the lid separating from the mold package or die detaching from the mold package.

Thus, a windowed non-ceramic package capable of being mounted via a mass reflow process is disclosed. The specific arrangements and methods described herein are merely illustrative of the principles of this invention. Numerous modifications in form and detail may be made without departing from the scope of the described invention. Although this invention has been shown in relation to a particular embodiment, it should not be considered so limited. Rather, the described invention is limited only by the scope of the appended claims.

What is claimed is:

1. An integrated circuit package comprising:
   a non-ceramic body; and
   a lid sealed to the non-ceramic body with a distinct adhesive material, the lid having a transparent window with a ceramic frame, said ceramic frame bordering said transparent window, wherein the integrated circuit package is capable of withstanding a mass reflow process.

2. The integrated circuit package of claim 1, wherein the transparent window is larger than 240 mils by 240 mils.

3. The integrated circuit package of claim 1, wherein the integrated circuit package is capable of withstanding a temperature of 225 degrees C. for up to 90 seconds.

4. The integrated circuit package of claim 1, wherein the lid is sealed to the non-ceramic body via a bis-phenol A type epoxy.

5. The integrated circuit package of claim 1, wherein the non-ceramic body is made of plastic.

6. An integrated circuit package comprising:
   a plastic mold;
   a lid sealed to the plastic mold with a distinct adhesive material, the lid comprising a ceramic frame bordering a transparent window, wherein the integrated circuit package is capable of withstanding a temperature of 225 degrees C. for up to 90 seconds without the lid becoming unsealed from the plastic mold.

7. The integrated circuit package of claim 6 wherein the transparent window is larger than 240 mils by 240 mils.

8. A packaged integrated circuit comprising:
   a mold package forming a cavity;
   a die disposed within the cavity; and
   a lid attached to the mold package with an intermediate joining material sealing the cavity, the lid comprising a transparent window, and a ceramic frame, the ceramic frame bordering the transparent window.

9. The packaged integrated circuit of claim 8, wherein the intermediate joining material is an adhesive.

10. The packaged integrated circuit of claim 9, wherein the adhesive is an epoxy.

11. The packaged integrated circuit of claim 8, wherein the die is attached to a surface of the non-ceramic body within the cavity by a die attach.

12. The packaged integrated circuit of claim 11, wherein the die attach is a low rigidity epoxy material.

13. An integrated circuit package comprising:
a non-ceramic body;
a lid comprising a transparent window bordered by a ceramic frame; and
an adhesive material;
wherein the lid is bonded to the non-ceramic body with the adhesive material, the adhesive material sealing a cavity formed by the inside surfaces of the lid and the non-ceramic body, the cavity suitable for housing an integrated circuit die.

14. The integrated circuit package of claim 13, wherein the non-ceramic body is made of a plastic material.

15. The integrated circuit package of claim 13, wherein the adhesive material is a bis-phenol A type epoxy.

* * * * *